(12) United States Patent
Yu et al.

(10) Patent No.: US 6,964,295 B1
(45) Date of Patent: Nov. 15, 2005

(54) HEAT DISSIPATION DEVICE

(75) Inventors: Guang Yu, Shenzhen (CN); Hsieh-Kun Lee, Tu-Cheng (TW); Cui-Jun Lu, Shenzhen (CN)

(73) Assignee: HON HAI Precision Industry Co., Ltd., (TW)

( * ) Notice: Subject to any disclaimer, the term of this patent is extended or adjusted under 35 U.S.C. 154(b) by 0 days.

(21) Appl. No.: 10/989,759

(22) Filed: Nov. 16, 2004

(51) Int. Cl.[7] .............................................. F28D 15/00
(52) U.S. Cl. ........................ 165/104.33; 165/104.21; 165/80.4; 361/697; 361/700; 257/715
(58) Field of Search ................. 165/104.33, 104.21, 165/104.26, 121, 185; 361/699, 700; 174/15.2; 257/714–716

(56) References Cited

U.S. PATENT DOCUMENTS

| | | | |
|---|---|---|---|
| 5,742,478 A * | 4/1998 | Wu ............................ | 361/704 |
| 6,189,601 B1 * | 2/2001 | Goodman et al. ......... | 165/80.3 |
| 6,542,364 B2 * | 4/2003 | Lai et al. ................... | 361/697 |
| 6,702,002 B2 * | 3/2004 | Wang ........................ | 165/80.3 |
| 6,745,824 B2 * | 6/2004 | Lee et al. .............. | 165/104.14 |
| 6,779,595 B1 * | 8/2004 | Chiang .................. | 165/104.33 |
| 2003/0019610 A1 * | 1/2003 | Liu ............................ | 165/80.3 |
| 2004/0226697 A1 * | 11/2004 | Liu ........................ | 165/104.33 |
| 2004/0244948 A1 * | 12/2004 | Luo ............................ | 165/80.3 |
| 2005/0067144 A1 * | 3/2005 | Chou ........................ | 165/80.3 |

FOREIGN PATENT DOCUMENTS

| | | |
|---|---|---|
| TW | 521844 | 2/2003 |
| TW | 535938 | 6/2003 |
| TW | 540983 | 7/2003 |
| TW | 542374 | 7/2003 |
| TW | 543828 | 7/2003 |

* cited by examiner

Primary Examiner—Terrell McKinnon
(74) Attorney, Agent, or Firm—Morris Manning & Martin; Tim Tingkang Xia, Esq.

(57) ABSTRACT

A heat dissipating device assembly includes a heat receiver, a heat sink defining two opposite ends and a plurality of channels formed between the two opposite ends, a fin member cooperating with the heat receiver to enclose the heat sink except the two opposite ends, a plurality of heat pipes connecting the heat receiver with the fin member, and a fan provided adjacent one of the two opposite ends for creating airflow to flow through the channels of the heat sink. The fin member includes a plurality of fins formed at the outer surface thereof for increasing heat dissipating surface of the heat dissipating device assembly.

12 Claims, 2 Drawing Sheets

HEAT DISSIPATION DEVICE

TECHNICAL FIELD

The present invention relates to heat dissipating devices, and particularly to a heat dissipating device which can efficiently dissipate heat from an electronic component.

BACKGROUND

As computer technology continues to advance, electronic components such as central processing units (CPUs), power supply units (PSUs) of computers are made to provide faster operational speeds and greater functional capabilities. When a CPU/PSU operates at a high speed in a computer enclosure, its temperature frequently increases greatly. It is desirable to dissipate the generated heat of the CPU/PSU quickly, for example, by using a heat sink attached to the CPU/PSU in the enclosure. This allows the CPU/PSU and other electronic components in the enclosure to function within their normal operating temperature ranges, thereby assuring the quality of data management, storage and transfer.

In order to promote the heat dissipation effect of the heat sink, fans have been widely used. Consequently, fan ducts have been widely used for guiding airflow from the fan to the heat sink and preventing airflow from escaping out of the heat sink without flowing therethrough. However, as CPUs/PSUs operate faster and faster and produce more and more heat, the effective heat dissipation surface area of the heat sink must be correspondingly increased. Conventional heat sink is difficult to satisfy heat dissipation requirement of modern CPUs/PSUs.

Thus, an improved heat dissipating device which has a large heat dissipation surface area is desired.

SUMMARY OF THE INVENTION

Accordingly, an object of the present invention is to provide a heat dissipating device which can efficiently dissipate heat from a heat generating component.

Another object of the present invention is to provide a heat dissipating device which has a large heat dissipation surface area with a compact structure.

To achieve the above-mentioned objects, a heat dissipating device in accordance with a preferred embodiment of the present invention comprises a heat receiver, a heat sink defining two opposite ends and a plurality of channels formed between the two opposite ends, a fin member cooperating with the heat receiver to enclose the heat sink except the two opposite ends, at least one heat pipe connecting the heat receiver with the fin member, and a fan provided adjacent one of the two opposite ends for creating airflow to flow through the channels of the heat sink.

Other objects, advantages and novel features of the present invention will be drawn from the following detailed description of a preferred embodiment of the present invention with attached drawings, in which:

DETAILED DESCRIPTION OF A PREFERRED EMBODIMENT

Figure 1:
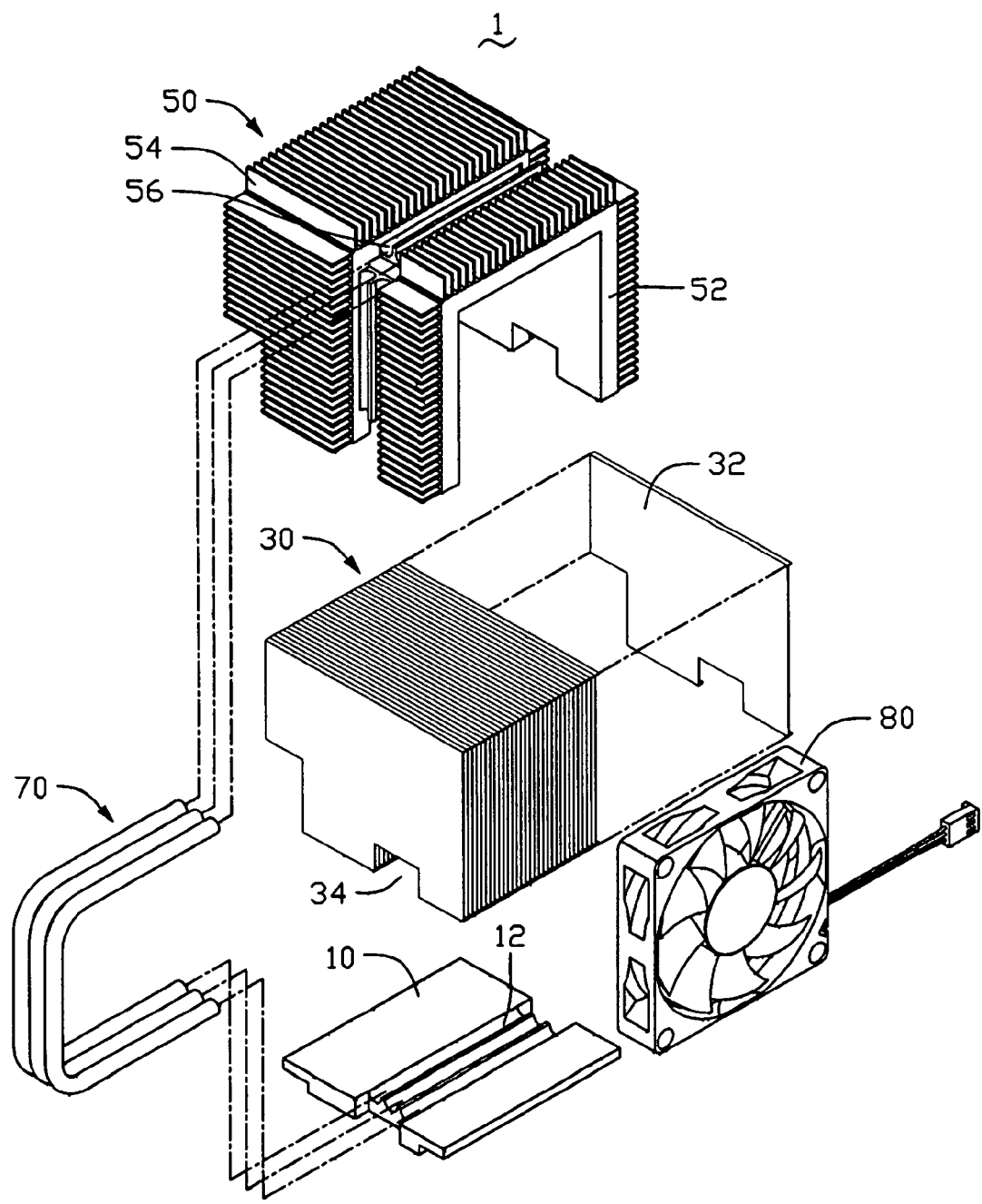
FIG. 1 is an exploded view of a heat dissipating device in accordance with a preferred embodiment of the present invention.
Figure 2:
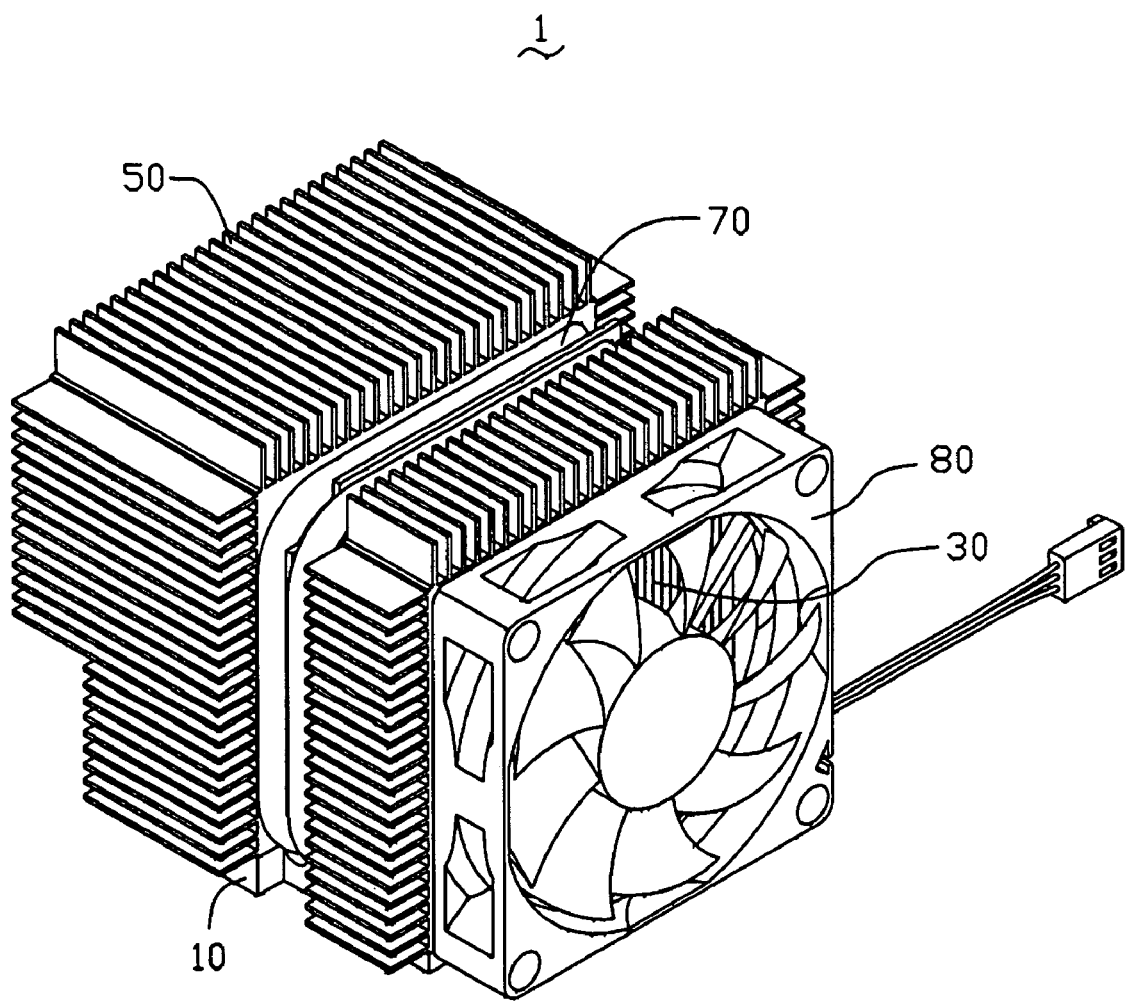
FIG. 2 is an assembled veiw of FIG. 1.

FIGS. 1–2 show a heat dissipating device 1 in accordance with a preferred embodiment of the present invention. The heat dissipating device 1 comprises a heat receiver 10, a heat sink 30, a fin member 50, a plurality of pipes 70 and a fan 80.

The heat receiver 10 is made of heat conductive material, such as copper, for contacting with an electronic device such as a CPU (not shown). The heat receiver 10 is board-shaped and defines a plurality of grooves 12 in the top surface thereof for receiving vaporized sections of the pipes 70.

The heat sink 30 comprises a plurality of parallel and spaced plates 32. Each plate 32 comprises a pair of flanges respectively formed at the top and bottom edges thereof and spaces from adjacent plates with a predetermined distance. A plurality of channels (not labeled) is therefore formed between the plates 32. Each plate 32 defines a cutout at the bottom portion thereof. The cutouts of the plates 32 cooperatively form a passage 34 perpendicular to the channels. Alternatively, the heat sink 30 can be any other shape, such as a pin-type heat sink comprising a plurality of pins replacing the plates 32, a fold-type heat sink of which the plates are folded from a continuous laminal piece.

The fin member 50 is U-shaped and comprises three side walls 52. Each side wall 52 integrally forms a plurality of parallel fins 54 on the outer face thereof by extrusion. The fins 54 extend in a longitudinal direction of the fin member 50. A plurality of grooves 56 is transversely defined at the outer faces of the side walls 52 for receiving condensed sections of the heat pipes 70. In the preferred embodiment, the heat pipes 70 are U-shaped and the grooves 56 only span two side walls 52. Alternatively, each of the side walls 52 defines grooves 56 receiving condensed sections of the heat pipes 70.

In assembly, the heat sink 30 is attached on the top surface of the heat receiver 10 by soldering or other means. The passage 34 is located over the grooves 12 of the heat receiver 10 for receiving the vaporized sections of the heat pipes 70. Alternatively, the heat sink 30 is integrally formed with the heat receiver 10. The fin member 50 is placed over the heat sink 30 and cooperates with the heat receiver 10 to enclose the heat sink 30 except two opposite ends thereof. The top flanges of the heat sink 30 contact with the inner surface of the fin member 50. The heat pipes 70 are secured to and connected between the heat receiver 10 and the fin member 50 by soldering or other means. The fan 80 is then secured to one end of the fin member 50 for producing forced airflow to flow through the channels of the heat sink 30 to thereby promote heat dissipation efficiency of the heat sink 30.

In the present invention, the heat receiver 10 contacts with the CPU for absorbing heat therefrom. The heat pipes 70 transfer one portion of the absorbed heat from the heat receiver 10 to the fin member 50 where the absorbed heat is dissipated via the fins 54. The bottom flanges of the heat sink 30 contact with the heat receiver 10 for transferring the other portion of the absorbed heat from the heat receiver 10 to the heat sink 30 for dissipation. The fin member 50 cooperates with heat receiver 10 to enclose the heat sink 30 for preventing forced airflow provided by the fan 80 from escaping out of the heat sink 30 without flowing through the channels thereof first. The combined fin member 50 and heat receiver 10 acts as a fan duct. Thus, no additional fan duct is needed. The fins 54 of the fin member 50 increase the effective heat dissipation surface of the heat disispation device 1. Therefore, the efficiency of the heat dissipation device 1 is improved.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipating device, comprising:
    a heat receiver;
    a heat sink defining two opposite ends;
    a fin member cooperating with the heat receiver to enclose the heat sink except said two opposite ends, the fin member comprising a plurality of fins integrally formed therewith; and
    at least one heat pipe connecting the heat receiver with the fin member, the at least one heat pipe comprising one portion being sandwiched between the heat receiver and the heat sink, and another portion placed on an outer face of the fin member.

2. The heat dissipating device as claimed in claim 1, further comprising a fan provided adjacent one of said two opposite ends for producing airflow through the heat sink.

3. The heat dissipating device as claimed in claim 1, wherein said heat pipe comprises a vaporized section contacting with the heat receiver and a condensed section contacting with the outer face of the fin member.

4. The heat dissipating device as claimed in claim 3, wherein the fin member is U-shaped and comprises three side walls from which the fins outwardly extends, the condensed section of said heat pipe contacting at least two of the side walls.

5. The heat dissipating device as claimed in claim 4, wherein said heat pipe is U-shaped.

6. The heat dissipating device as claimed in claim 1, wherein the heat sink comprises a plurality of spaced L-shaped plates, a plurality of channels being formed between the plates and perpendicular to the heat receiver.

7. A heat dissipating device comprising:
    a heat sink defining two opposite ends and a plurality of channels formed between said two opposite ends;
    a fan duct enclosing the heat sink except said two opposite ends;
    at least one heat pipe attachably surrounding the fan duct at the outer face thereof; and
    a fan secured to one of the heat sink and the fan duct for producing airflow to flow through the channels.

8. The heat dissipating device as claimed in claim 7, wherein the fan duct comprises a plurality of fins integrally formed at the outer face thereof by extrusion.

9. The heat dissipating device as claimed in claim 8, wherein the fan duct comprises a heat receiver on which the heat sink is attached, and a fin member.

10. The heat dissipating device as claimed in claim 9, wherein the fin member is U-shaped and comprises three side walls from which the fins outwardly extend, said heat pipe contacting at least two of the side walls.

11. The heat dissipating device as claimed in claim 10, wherein said heat pipe is U-shaped.

12. A heat dissipating device comprising:
    a heat receiver;
    a heat sink defining two opposite ends and a plurality of channels formed between said two opposite ends; a fin member cooperating with the heat receiver to enclose the heat sink except said two opposite ends, the fin member providing a plurality of fins at the outer surface thereof;
    a fan secured with one of the heat sink and the fin member for producing airflow to flow through the channels; and
    at least one heat pipe connecting the heat receiver and the fin member, wherein the fan is secured to the fin member adjacent to one of the said two opposite ends the fin member is U-shaped and comprises three side walls from which the fins integrally extend, said heat pipe contacting at least two of the side walls.

* * * * *